(12) United States Patent
Smith et al.

(10) Patent No.: US 11,440,002 B2
(45) Date of Patent: Sep. 13, 2022

(54) MICROFLUIDIC CHIPS WITH ONE OR MORE VIAS FILLED WITH SACRIFICIAL PLUGS

(71) Applicant: International Business Machines Corporation, Armonk, NY (US)

(72) Inventors: Joshua T. Smith, Croton-on-Hudson, NY (US); Robert Bruce, White Plains, NY (US); Jyotica V. Patel, Port Chester, NY (US); Benjamin Wunsch, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 566 days.

(21) Appl. No.: 16/168,292

(22) Filed: Oct. 23, 2018

(65) Prior Publication Data
US 2020/0122139 A1 Apr. 23, 2020

(51) Int. Cl.
*B81B 7/04* (2006.01)
*B01L 3/00* (2006.01)

(52) U.S. Cl.
CPC . *B01L 3/502707* (2013.01); *B01L 2300/0809* (2013.01); *B01L 2300/0893* (2013.01); *B01L 2300/12* (2013.01)

(58) Field of Classification Search
None
See application file for complete search history.

(56) References Cited

U.S. PATENT DOCUMENTS

| | | | |
|---|---|---|---|
| 7,863,189 B2 | 1/2011 | Basker et al. | |
| 9,269,664 B2 | 2/2016 | Yang et al. | |
| 9,269,679 B2 | 2/2016 | Teng et al. | |
| 9,449,906 B2 | 9/2016 | Kirby et al. | |
| 9,469,523 B2 | 10/2016 | Liu et al. | |
| 9,636,675 B2 | 5/2017 | Astier et al. | |
| 9,700,891 B2 | 7/2017 | Smith et al. | |
| 2003/0040173 A1* | 2/2003 | Fonash | F16K 99/0003 438/622 |

(Continued)

OTHER PUBLICATIONS

Nge, Pamela, et al. "Advances in Microfluidic Materials, Functions, Integration, and Applications." Chemical Reviews2013, 113, 2550-2583. 34 pages.

(Continued)

*Primary Examiner* — Paul S Hyun
(74) *Attorney, Agent, or Firm* — Amin, Turocy & Watson, LLP

(57) ABSTRACT

Techniques regarding microfluidic chips with one or more vias filled with sacrificial plugs and/or manufacturing methods thereof are provided herein. For example, one or more embodiments described herein can comprise an apparatus, which can comprise a silicon device layer of a microfluidic chip comprising a plurality of vias extending through the silicon device layer. The plurality of vias comprise greater than or equal to about 100 vias per square centimeter of a surface of the silicon device layer and less than or equal to about 100,000 vias per square centimeter of the surface of the silicon device layer. Additionally, the apparatus can comprise a plurality of sacrificial plugs positioned in the plurality of vias.

20 Claims, 12 Drawing Sheets

(56) References Cited

U.S. PATENT DOCUMENTS

| | | | | |
|---|---|---|---|---|
| 2004/0208792 | A1* | 10/2004 | Linton | B01L 3/508 |
| | | | | 422/552 |
| 2005/0127511 | A1* | 6/2005 | Yang | H01L 21/76805 |
| | | | | 257/758 |
| 2007/0026381 | A1* | 2/2007 | Huang | B03C 1/30 |
| | | | | 435/4 |
| 2009/0014360 | A1* | 1/2009 | Toner | G01N 15/10 |
| | | | | 209/208 |
| 2010/0068105 | A1 | 3/2010 | Green | |
| 2014/0264937 | A1* | 9/2014 | Meitl | H01L 23/147 |
| | | | | 257/774 |

OTHER PUBLICATIONS

Mcdonald, J. C., et al. "Fabrication of microfluidic systems in poly(dimethylsiloxane)." Electrophoresis 2000, 21, 27-40. 14 pages.

Dang, Bing, et al. "Integrated Microfluidic Cooling and Interconnects for 2D and 3D Chips." IEEE Transactions on Advanced Packaging, vol. 33, No. 1, Feb. 2010. 9 pages.

Smith, J.T., et al., "Microfluidic chips with one or more vias," U.S. Appl. No. 15/875,940, filed Jan. 19, 2018. 28 pages.

Wunsch, B.H. et al. "Detection of Nucleic Acid Sequences Using Deterministic Lateral Displacement Arrays." U.S. Appl. No. 16/007,347, filed Jun. 13, 2018. 50 pages.

* cited by examiner

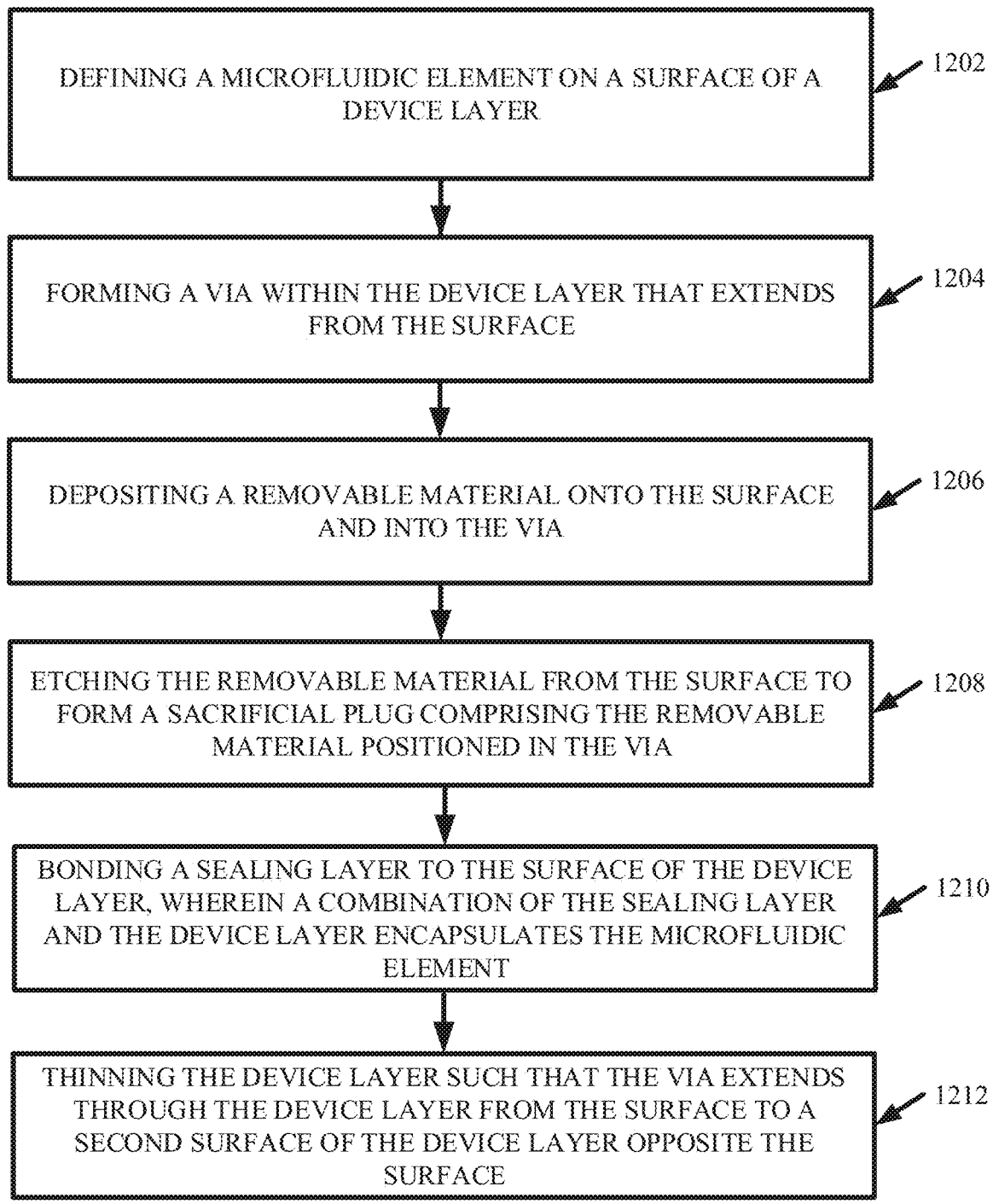

MICROFLUIDIC CHIPS WITH ONE OR MORE VIAS FILLED WITH SACRIFICIAL PLUGS

BACKGROUND

The subject disclosure relates to microfluidic chips comprising thin substrates (e.g., having a thickness ranging between 7 micrometer meters (μm) and/or 500 μm) and/or a high density of vias, and more specifically, to microfluidic chips manufactured in accordance with one or more methods that can use sacrificial plugs positioned in fluid vias to protect chip features from one or more processes through manufacturing and/or back end chip singulation.

Extensive and growing interest in lab-on-a-chip ("LOC") technologies is evident from the tens of thousands of currently available in literature from close-system microfluidic publications alone. Such a broad interest in microfluidic technologies is representative of their many advantages over traditional laboratory methods, such as the ability to carry out separation and detection with high resolution and sensitivity, need for only very small quantities of sample and reagent, small footprint of the analytical devices these chips contain, low cost of manufacture, and short time of analysis.

With such great potential benefits, several material options and techniques have been explored to integrate microfluidic features and devices to separate, detect, and manipulate biological analytes. For microfluidic applications requiring high-density parallelization, biological samples and other fluids introduced into a silicon chip must have exit points, or fluidic outlets, at a high packing density to collect material. When fluidic vias are integrated at low density, structured glass (glass with holes) can be bonded to silicon as a last process step or defined in thermoplastics; however, at high density, wherein hundreds or thousands of vias are required at small sizes (e.g., 50 micrometers (μm) diameters or less), these standard options are no longer possible, either physically (e.g., in silicon due difficulties of etching through the thickness of a standard 200 millimeter (mm) or 300 mm wafer) or practically from a cost perspective (e.g., due to structured glass manufacturing limitations).

For example, vias of small sizes require thin substrates to etch completely through to create fluidically accessible holes, as features with aspect ratios greater than 1:10 (via diameter:via depth) are challenging to create using conventional etching processes (e.g., reactive-ion etching ("RIE")). Also, etching completely through a wafer can be problematic for conventional etching processes at least because RIE chambers can have inductively coupled wafer chucks and/or use vacuum systems that can be damaged during processing if the wafer is etched completely through. Further, a thin wafer requirement for the small diameter vias can typically necessitate the use of a carrier wafer to support the thin wafer, which can be very brittle due to its thinness (e.g., a thinness of 50 μm for 5 μm diameter vias). Moreover, thin wafers cannot be readily debonded from carrier wafers after polishing as the silicon comprising the thin wafers can be too brittle. Additionally, formation of the vias during one or more early stages of manufacturing can cause fluidic wicking and/or capillary wetting of microfluidic features due to post via wet processing common in semiconductor manufacturing. Therefore, a method of manufacturer is required that can accomplish this feat to enable applications that require a high density of vias (e.g., nanoscale deterministic lateral displacement ("nanoDLD") arrays) for separating particles (e.g., exosomes).

A key challenge for LOC manufacturing in silicon, when high-density vias are implemented into a design, is to make the vias fluidically accessible and eliminate downstream wets processing common in semiconductor manufacturing, such as wet cleans. Wet processes can wick these fluids into the microfluidic device through capillary action, rendering the device unusable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses, methods, and/or systems regarding microfluidic chips with high via density and/or manufactured using sacrificial plugs to protect the vias are described.

According to an embodiment, an apparatus is provided. The apparatus can comprise a silicon device layer of a microfluidic chip comprising a plurality of vias extending through the silicon device layer. The plurality of vias can comprise greater than or equal to about 100 vias per square centimeter of a surface of the silicon device layer and less than or equal to about 100,000 vias per square centimeter of the surface of the silicon device layer. Additionally, the apparatus can comprise a plurality of sacrificial plugs positioned in the plurality of vias. An advantage of such an apparatus can be a device layer that is protected from damage during microfluidic chip singulation.

In some examples, the plurality of sacrificial plugs can be fully extractable by a dry debonding process. An advantage of such an apparatus can be that the plurality of vias can function as fluidic vias upon removal of the sacrificial plugs.

According to an embodiment, an apparatus is provided. The apparatus can comprise a silicon device layer of a microfluidic chip comprising a plurality of vias extending through the silicon device layer. Also, the plurality of vias can consist of removable sacrificial plugs that fill the plurality of vias. An advantage of such an embodiment can be that the removable sacrificial plugs can protect the vias during one or more manufacturing processes of the microfluidic chip.

In some examples, the plurality of vias can comprise greater than or equal to about 100 vias per square centimeter of a surface of the silicon device layer and less than or equal to about 100,000 vias per square centimeter of the surface of the silicon device layer. An advantage of such an apparatus can be use of a high density of vias that are protected during one or more manufacturing processes and facilitate high throughput operations post manufacturing.

According to an embodiment, a method is provided. The method can comprise defining a microfluidic element on a surface of a device layer. The method can also comprise forming a via within the device layer that extends from the surface. Further, the method can comprise depositing a sacrificial material onto the surface and into the via. Additionally, the method can comprise removing the sacrificial material from the surface to form a sacrificial plug from the sacrificial material positioned in the via. An advantage of such a method can be that the via can be formed on the surface of the device layer comprising the microfluidic elements; thereby, enabling precise via placement and/or formation.

In some examples, the method can also comprise bonding a sealing layer to the surface of the device layer. A combination of the sealing layer and the device layer can encapsulate the microfluidic element. Also, the method can further comprise thinning the device layer such that the via extends through the device layer from the surface to a second surface of the device layer opposite the surface. An advantage of such a method can be that the protected via can be formed at one or more early stages of the manufacturing process without impeding operation of other manufacturing processes.

BRIEF DESCRIPTION OF THE DRAWINGS

FIG. 12 illustrates a flow diagram of an example, non-limiting method that can facilitate manufacturing one or more microfluidic chips in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with conventional microfluidic chips utilizing nanoDLD arrays and/or the manufacturing thereof; the present disclosure can be implemented to produce a solution to one or more of these problems in the form of a microfluidic chip comprising a high density of fluidic vias protected by sacrificial plugs during one or more stages of manufacturing. For example, various embodiments herein can describe a via-first manufacturing method of one or more microfluidic chips comprising a high density of fluidic vias, wherein the fluidic vias can be created in one or more early stages of the manufacturing process. Further, the fluidic vias can be filled with a removable material to create sacrificial plugs positioned within the fluidic vias that can protect the vias during one or more stages of manufacturing. Thus, one or more embodiments can regard a microfluidic chip with a high density of protected vias that can undergo further manufacturing processes (e.g., chip singulation) without degradation. Subsequent to the further manufacturing processes (e.g., chip singulation), the sacrificial plugs located inside the vias can be removed, thereby the plurality of vias to be in fluidic communication with one or more microfluidic elements comprising the microfluidic chip. Advantageously, the microfluidic chip comprising sacrificial plugs can be subject to one or more manufacturing processes that would impair traditional, unprotected microfluidic elements. Further, formation of the fluidic vias at one or more early stages of manufacturing can enable via placement and/or formation that is more precise and/or accurate than conventional manufacturing techniques.

Figure 1:
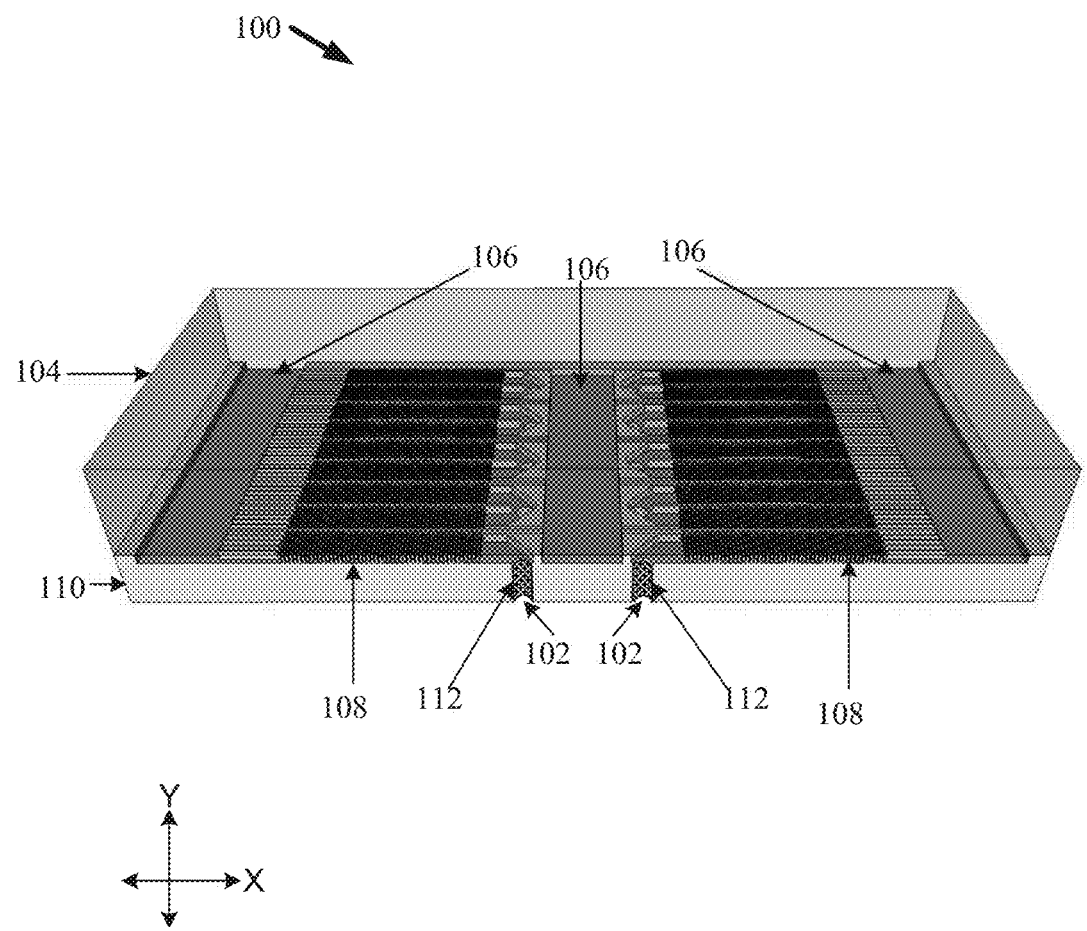
FIG. 1 illustrates a diagram of an example, non-limiting microfluidic chip that can comprise a high density of vias protected by sacrificial plugs in accordance with one or more embodiments described herein.

FIG. 1 illustrates a diagram of an example, non-limiting microfluidic chip 100 in accordance with one or more embodiments described herein. The microfluidic chip 100 can comprise one or more vias 102, a sealing layer 104, one or more buses 106, one or more microfluidic elements 108, and/or a device layer 110. In one or more embodiments, the microfluidic chip 100 can comprise a high density of vias 102 within the device layer 110. In some embodiments, the microfluidic chip 100 can comprise a thin device layer 110 and/or one or more vias 102 in fluid communication with the one or more microfluidic elements 108, which can be characterized by one or more dimensions that are greater than or equal to 1 nanometer and less than or equal to 10 millimeters. The sealing layer 104 and/or the device layer 110 can respectively comprise silicon (e.g., silicon compositions), glass, a combination thereof, and/or the like.

Silicon is a well-established material in fabrication methods that can utilize subtractive (e.g. wet or dry etching) or additive methods (e.g. metal or chemical vapor deposition) to create microfluidic structures with nanoscale placement and features. High elastic modulus (e.g., characterized by 130-180 gigapascals (GPa)) can form rigid well-defined structures. Silanol group (—Si—OH) surface chemistry is well developed (e.g., surface modification with silanes). Further, silicon's ability to scale and integrate to provide complex functionality can be very high. However, silicon is not transparent to visible light, so typical fluorescence detection or fluid imaging is challenging; although this can be overcome by bonding a transparent material to the surface of silicon, such as a polymer or glass. Also, silicon's high elastic modulus can make silicon difficult to be made into active fluidic components such as valves and pumps.

Glass fabrication methods exist that can utilize subtractive or additive methods to create microfluidic structures albeit not at the precision and scale of silicon. Glass can have low background fluorescence, and like silicon, can have silanol-based surface modification chemistries readily available. Also, glass can be compatible with biological samples, can have relatively low nonspecific adsorption, and can be gas impermeable. However, compared to silicon, glass fabrication methods are not nearly as broad or precise (e.g., nanoscale features for microfluidics that are possible in silicon can be difficult to implement in glass). Glass can also have a large, composition-dependent elastic modulus (e.g., hybrid devices can be required for active components such as valves and pumps).

Other materials that can typically comprise microfluidic chip technologies can include ceramics, elastomers, thermoplastics, and/or paper. However, one or more embodiments of the microfluidic chips 100 described herein can comprise silicon and/or glass materials due at least in part to one or more structural and/or manufacturing difficulties ceramics, elastomers, thermoplastics, and/or paper can exhibit in microfluidic platforms. For example, low-temperature cofired ceramics ("LTCC") can be fabricated into complex three-dimensional devices, wherein each layer can be inspected for quality control before assembling. Electrodes can be deposited using expansion matched metal pastes (e.g., for added functionality for detection and separation). Also, organically modified ceramics can provide an optically transparent, UV-curable material. However, high-density ceramic electronics and multiplexed or integrated ceramic architectures can be difficult to implement. Further, features such as electrodes and channels can typically be 10's to 100's of microns in size and. not adaptable to certain types of microfluidic elements such as smaller pillar arrays or nanochannels. Also, ceramics can have a high elastic modulus, thereby rendering ceramics difficult to be made into active fluidic components such as valves and pumps. Moreover, ceramics can be difficult to hybridize with other materials.

Regarding elastomers, polydimethylsiloxane ("PDMS") can be low in cost and is perhaps the most common microfluidic substrate. Elastomers can be easy to fabricate using a number of processes, including conventional machining and photolithography, and elastomers can be cast, stamped, and cured on molds. Elastomers can have low elastic modulus (e.g., 300-500 kilopascals (kPa)), thereby making them useful for making values and pumps. PDMS can be gas permeable and thereby useful for oxygen and/or carbon dioxide transport in cellular studies. Also, elastomers can be transparent in the visible range, so typical fluorescence detection or fluid imaging can be employed. However, since PDMS can be gas permeable, it can cause problematic bubble formation. Also, PDMS can be a hydrophobic material and thereby susceptible to nonspecific adsorption and permeation by hydrophobic molecules. Other example elastomers can include, but are not limited to: thermoset polyester ("TPE"), polyfluoropolyether diol methacrylate ("PFPE-DMA"), and/or polystyrene ("PS").

Further, thermoplastics can be highly moldable and manufacturable given they are durable, amenable to micromachining, hot embossing, and injection molding processes. Thermoplastics can be optically clear, resistant to permeation of small molecules, and stiffer than elastomers. Also, thermoplastics can be thermally, and/or laser, bonded to seal two layers together. For example, cyclic-olefin copolymer ("COC") can be suitable for use with most solvents and aqueous solutions and can have low background fluorescence. Further, thermoplastics can have low manufacturing costs. However, COC can be hydrophobic, and thereby require surface modification to reduce nonspecific adsorption. Also, thermoplastics can typically require another medium (e.g., a master mold) to replicate many devices (e.g. silicon master).

Moreover, paper can be extremely cheap and readily available, can be disposed of by burning or natural degradation, and can be easily patterned and functionalized. Porous paper can allow for a combination of flow, filtering, and separation. Also, paper can be biologically compatible and chemically modified through composition or formulation changes or by implementing surface chemistry. However, paper can rely on passive capillary action for operation, and thereby paper system may not be amenable to more complex functionality or material hybridization.

Considerations regarding the selection of materials comprising the sealing layer 104 and/or the device layer 110 can include, but are not limited to: the required function of the layers, the degree of microfluidic element 108 integration needed on the layers, and/or the final application of the microfluidic chip 100. In one or more embodiments, the choice of silicon and/or silicon-glass systems are most attractive in LOC applications requiring high-density device integration, parallelization, multi-functional or multi-device arrangements (separation and detection, for example) or in application requiring embedded microelectronics. For example, the sealing layer 104 can comprise glass and the device layer 110 can comprise silicon (e.g., a crystalline silicon such as a silicon wafer). In an embodiment in which the device layer 110 comprises silicon, high pressures can be applied to the microfluidic element 108 as a driving force to operate the microfluidic chip 100 without deforming the structures.

The sealing layer 104 can be bonded to the device layer 110. The sealing layer 104 can have greater rigidity than the device layer 110, thereby providing enhanced rigidity to the device layer 110 during manufacturing of the microfluidic chip 100. Further, the sealing layer 104 can encapsulate the one or more microfluidic elements 108 and/or the one or more buses 106; thereby protected the one or more microfluidic elements 108 and/or the one or more buses 106 during manufacturing of the microfluidic chip 100. The sealing layer 104 can have a thickness greater than or equal to 100 µm and less than or equal to 2.5 mm. The device layer 110 can have a thickness greater than or equal to 7 µm and less than or equal to 500 µm. In one or more embodiments, the sealing layer 104 can be thicker than the device layer 110.

The one or more buses 106 (e.g., fluid buses) can be embedded, subtractively patterned, and/or otherwise etched into the device layer 110. The one or more buses 106 can serve as channels that guide and/or transport fluid through the microfluidic chip 100 with low fluidic resistance. For example, the one or more buses 106 can form a bus network that can carry fluid to and/or from the one or more microfluidic elements 108. The microfluidic elements 108 can be embedded within the device layer 110 and/or be located on a top surface of the device layer 110, which is bonded to the sealing layer 104. The microfluidic elements 108 can comprise one or more devices that can utilize deterministic displacement arrays and/or deterministic lateral displacement technologies ("DLD"), such as condenser arrays (e.g., microscale condenser arrays and/or nanoscale condenser arrays) and/or nanoDLD arrays. Further example microfluidic elements 108 can include, but are not limited to: microscale and/or nanoscale pillars, channels, biosensors, fluid mixing features, fluidic bus networks, fluidic inlets, and/or fluidic outlets.

One or more of the buses 106 and/or the microfluidic elements 108 can be in fluid communication with the one or more vias 102. The one or more vias 102 can traverse through the device layer 110. For example, the one or more vias 102 can extend from a first side of the device layer 110 to a second side of the device layer 110 (e.g., wherein the sealing layer 104 can be boned to the second side of the device layer 110).

In one or more embodiments, the microfluidic chip 100 can have a high density of vias 102 traversing the device layer 110. For example, the microfluidic chip 100 can comprise hundreds to tens of thousands of vias 102 per square centimeter of the device layer 110. For instance, the microfluidic chip 100 can comprise greater than or equal to 100 vias 102 per square centimeter of the device layer 110 and less than or equal to 100,000 vias 102 per square centimeter of the device layer 110. Additionally, the one or more vias 102 can have diameters greater than or equal to 5 μm and less than or equal to 0.5 mm. Moreover, respective vias 102 of the one or more vias 102 can share a common diameter or can have different diameters. One of ordinary skill in the art will recognize that although FIG. 1 shows a particular number of vias 102, buses 106, and/or microfluidic elements 108, the architecture of the microfluidic chip 100 is not so limited. For example, the microfluidic chip 100 can comprise fewer or additional vias 102, buses 106, and/or microfluidic elements 108 than those depicted in FIG. 1.

Additionally, the plurality of vias 102 can be filled with a plurality of sacrificial plugs 112, which can protect the plurality of vias 102 during one or more stages of manufacturing. For example, a sacrificial plug 112 can be positioned within each via 102. The plurality of sacrificial plugs 112 can extend through the total length of the plurality of vias 102 (e.g., along the "Y" direction shown in FIG. 1) or can fill a portion of the plurality of vias 102. For instance, the plurality of sacrificial plugs 112 can be recessed within the plurality of vias 102. In one or more embodiments, the plurality of sacrificial plugs 112 can be recessed into the plurality of vias 102 by a distance greater than or equal to 1 μm and less than or equal to 100 μm. Additionally, the plurality of sacrificial plugs 112 can be completely removable by one or more dry debonding processes. Thus, the plurality of sacrificial plugs 112 can block fluid communication through the plurality of vias 102 during one or more stages of manufacturing the microfluidic chip 100 and can be removed subsequent to the manufacturing so as to enable fluid communication through the plurality of vias 102 and/or operation of the microfluidic chip 100.

The plurality of sacrificial plugs 112 can be formed using a sacrificial material that can be stable at temperatures required in downstream processing of the microfluidic chip 100 (e.g., temperatures that are greater than or equal to 200 degrees Celsius (° C.) and less than or equal to 300° C.). For example, the sacrificial material can avoid cross-linking at the downstream processing temperatures. Additionally, the sacrificial material can be able to be etched back into the plurality of vias 102 to a depth greater than or equal to 1 μm and less than or equal to 100 μm. For example, the sacrificial material can be etched back with high selectivity to other materials (e.g., microfluidic elements 108) positioned on and/or within the device layer 110 (e.g., including the device layer 110 itself) using a dry etch process such as oxygen plasma etching. Further, the sacrificial material can enable the sealing layer 104 to be anodically bonded to the device layer 110 after the plurality of vias 102 are formed. Moreover, the sacrificial material can be fully extractable with one or more dry debonding processes after manufacturing of the microfluidic chip 100 (e.g., subsequent to wafer dicing and/or chip singulation). Example sacrificial materials can include, but are not limited to: polyimides (e.g., HD-3007 polyimide adhesive), temporary wafer bonding materials (e.g., BrewerBOND 305 temporary wafer bonding material), B-staged bisbenzocyclobutene ("BCB") monomers derived from resin (e.g., Cyclotene resin), a combination thereof, and/or the like.

Figure 2:
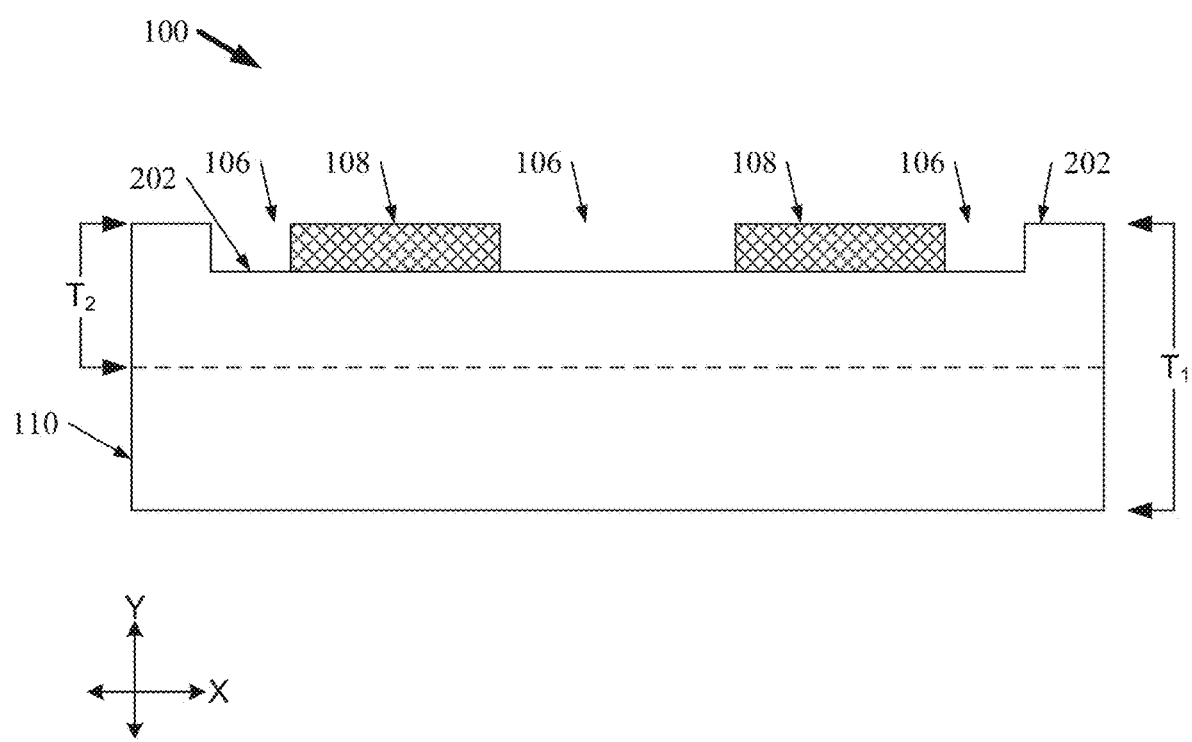
FIG. 2 illustrates a diagram of an example, non-limiting microfluidic chip at a first stage of manufacturing in accordance with one or more embodiments described herein.

FIG. 2 illustrates a diagram of an example, non-limiting microfluidic chip 100 at a first stage of manufacturing in accordance with one or more embodiments described herein. Repetitive description of like elements employed in other embodiments described herein is omitted for sake of brevity. For example, FIG. 2 can show a cross-section of the microfluidic chip 100 after completion of the first stage of manufacturing. As shown in FIG. 2, the device layer 110 can have an initial thickness (e.g., represented by "$T_1$") during the first stage of manufacturing. Further, the initial thickness (e.g., represented by "$T_1$") can be less than a final thickness (e.g., represented by "$T_2$") of the device layer 110 once the microfluidic chip 100 is manufactured. For example, the dashed line in FIG. 2 can delineate the final depth to which the device layer 110 will extend in order to achieve the final thickness (e.g., represented by "$T_2$").

The first stage of manufacturing can comprise defining one or more microfluidic elements 108 and/or one or more buses 106 onto the top surface 202 of a device layer 110. For example, the one or more microfluidic elements 108 and/or the one or more buses 106 can be defined on a first lithography layer and patterned unto the top surface 202 of the device layer 110. Depending on the minimum feature size of the microfluidic elements 108 and/or buses 106, a number of lithography options can be employed during the first stage of manufacturing, including but not limited to: various wavelength optical lithography (mid-ultraviolet ("UV"), deep-UV, 193 nm (e.g. argon fluoride laser)), immersion lithography, e-beam lithography, imprint lithography, interference lithography, x-ray lithography, a combination thereof, and/or the like.

Figure 3:
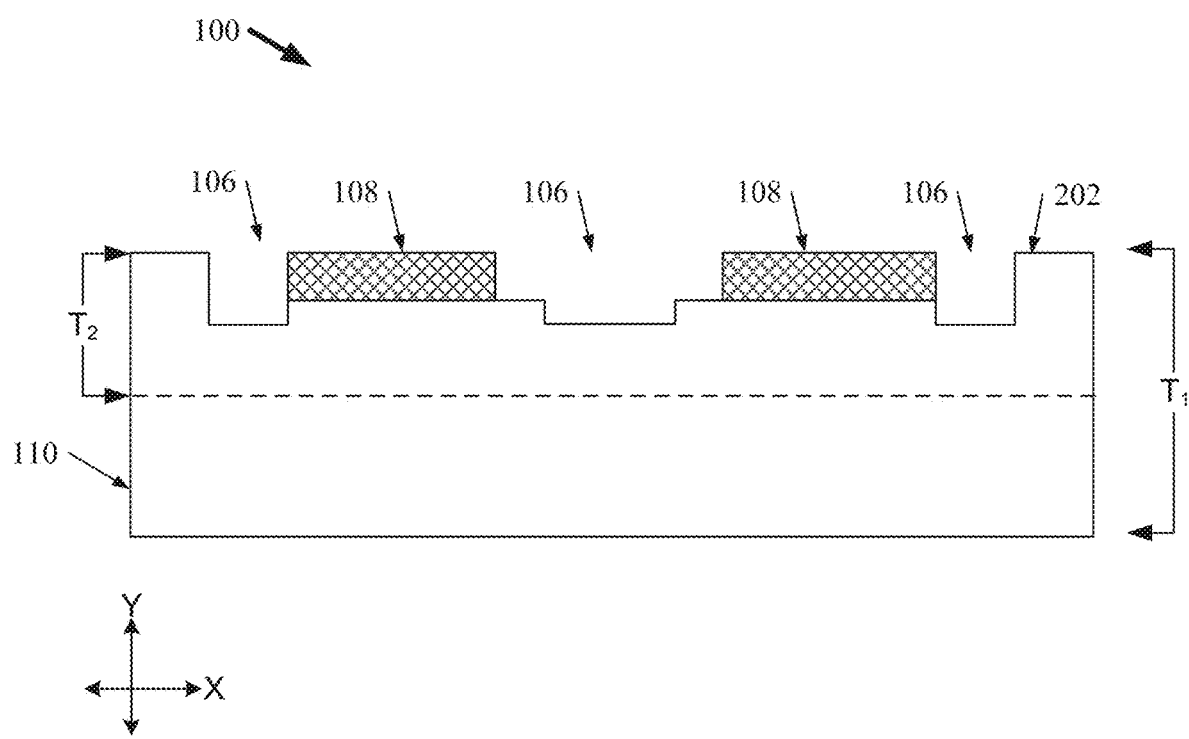
FIG. 3 illustrates a diagram of an example, non-limiting microfluidic chip at a second stage of manufacturing in accordance with one or more embodiments described herein.

FIG. 3 illustrates a diagram of an example, non-limiting microfluidic chip 100 at a second stage of manufacturing in accordance with one or more embodiments described herein. Repetitive description of like elements employed in other embodiments described herein is omitted for sake of brevity. Manufacturing of the microfluidic chip 100 can optionally comprise the second stage of manufacturing described herein. For example, FIG. 3 can show a cross-section of the microfluidic chip 100 after completion of the second stage of manufacturing.

The second stage of manufacturing can comprise deepening the one or more buses 106. Respective buses 106 can be deepened in their entirety, or only a portion of a respective bus 106 can be deepened. The deepening can be facilitated by a second lithography layer, which can be used in conjunction with an etch process (e.g., RIE, tetramethylammonium hydroxide ("TMAH") etching, potassium hydroxide ("KOH") etching, a combination thereof, and/or the like). The deepening can be omitted for sufficiently small microfluidic chips 100 or those whose microfluidic elements 108 are very fluidically restrictive. Essentially, parallel device arrays or other microfluidic elements 108 can drop most of the fluidic resistance to avoid one or more discrepancies in fluidic rate conditions in the one or more buses 106 (e.g., the plurality of buses 106 can comparably have very high fluidic conductance).

Figure 4:
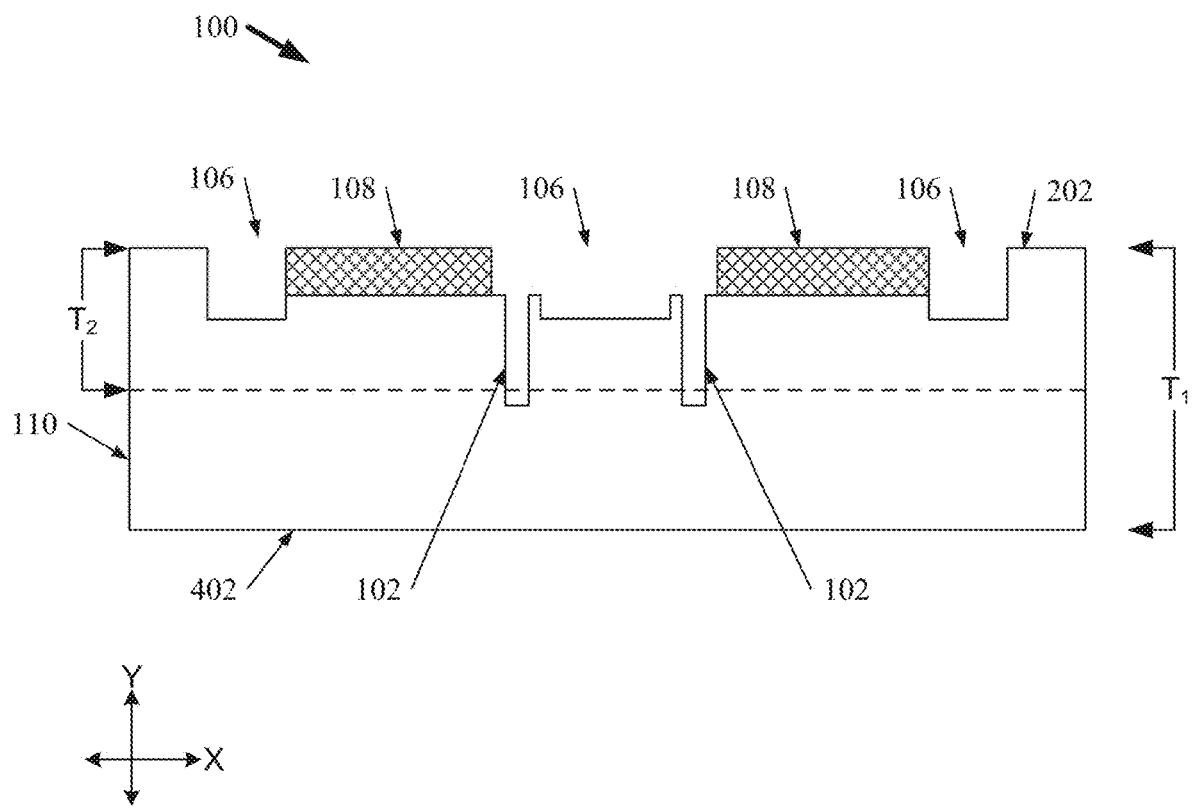
FIG. 4 illustrates a diagram of an example, non-limiting microfluidic chip at a third stage of manufacturing in accordance with one or more embodiments described herein.

FIG. 4 illustrates a diagram of an example, non-limiting microfluidic chip 100 at a third stage of manufacturing in accordance with one or more embodiments described herein. Repetitive description of like elements employed in other embodiments described herein is omitted for sake of brevity. For example, FIG. 4 can show a cross-section of the microfluidic chip 100 after completion of the third stage of manufacturing.

At the third stage of manufacturing, the plurality of vias 102 can be formed in the device layer 110. As shown in FIG. 4, the plurality of vias 102 can formed into the top surface 202 of the device layer 110. For example, the plurality of vias 102 can extend from the top surface 202 of the device layer 110 to a bottom surface 402 of the device layer 110, which can be opposite the top surface 202. The plurality of vias 102 can be formed using one or more etching processes, including, but not limited to: RIE, a tetramethylammonium hydroxide ("TMAH") wet etch solution, potassium hydroxide ("KOH"), a combination thereof, and/or the like. For instance, a third lithography layer can be used to pattern the one or more vias 102 in a hard mask, such as silicon oxide and/or silicon nitride, followed by removal of the resist and cleaning of the device layer 110, after which the one or more vias 102 can be defined by a RIE process. Alternatively, the third lithography layer can be used as the etch mask itself and can be removed with an oxygen plasma after the one or more vias 102 have been opened.

The one or more vias 102 can be extend to the device layer 110 to a depth that is greater than or equal to the final thickness (e.g., represented by "$T_2$") of the device layer 110 after manufacturing of the microfluidic chip 100 is complete. Additionally, the one or more vias 102 can be formed to a uniform depth (e.g., as shown in FIG. 4), or the one or more vias 102 can be formed to various depths within the device layer 110. For example, a first via 102 can extend deeper into the device layer 110 than a second via 102 so long as both the first via 102 and/or the second via 102 extend to a depth that is greater than or equal to the final thickness (e.g., represented by "$T_2$") of the device layer 110. Additionally, the third stage of manufacturing can comprise optional steps such as oxidation processes and/or deposition processes (e.g., atomic layer deposition ("ALD")) following the formation of the one or more vias 102 to provide a suitable surface for interfacing with a particular fluid and/or for anodic bonding.

Figure 5:
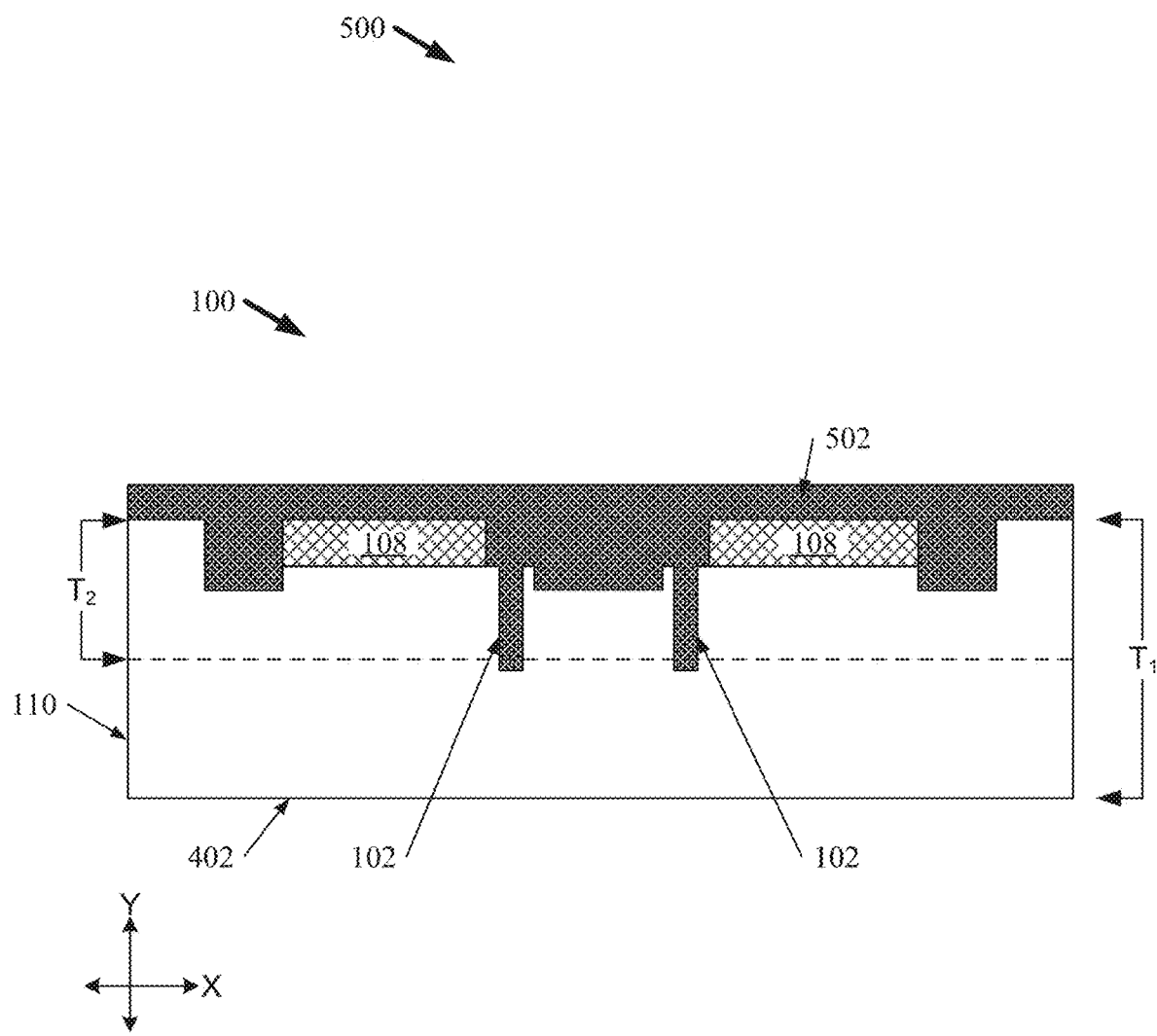
FIG. 5 illustrates a diagram of an example, non-limiting microfluidic chip at a fourth stage of manufacturing in accordance with one or more embodiments described herein.

FIG. 5 illustrates a diagram of an example, non-limiting microfluidic chip 100 at a fourth stage of manufacturing in accordance with one or more embodiments described herein. Repetitive description of like elements employed in other embodiments described herein is omitted for sake of brevity. For example, FIG. 5 can show a cross-section of the microfluidic chip 100 after completion of the fourth stage of manufacturing.

At the fourth stage of manufacturing, a sacrificial layer 502 can be deposited onto the top surface 202 of the device layer 110 (e.g., including the one or more microfluidic elements 108 and/or the one or more buses 106) and/or into the plurality of vias 102. In one or more embodiments, the sacrificial layer 502 can be deposited onto a specific region of the top surface 202. In one or more embodiments, the sacrificial layer 502 can be deposited on the top surface 202 of the device layer 110, the one or more microfluidic elements 108, the one or more buses 106, and/or the one or more vias 102. The sacrificial layer 502 can comprise the sacrificial material described herein.

However, one or more standard deposition processes can be inapplicable to facilitate depositing the sacrificial layer 502. For example, standard spin coating can fail to wet to the one or more vias 102 as air becomes trapped inside the one or more vias 102, which can be problematic as the dimensions of the one or more vias 102 scale (e.g., shear forces of the air bubbles trapped inside the one or more vias 102 can become increasingly significant). Example deposition processes that can be utilized to deposit the sacrificial layer 502 can include, but are not limited to: spin coating in a vacuum, spray coating, roller coating, dip coating, a combination thereof, and/or the like. In one or more embodiments, the sacrificial layer 502 can be deposited onto the top surface 202 of the device layer 110 and then forced into the one or more vias 102. For example, the sacrificial layer 502 can be deposited onto the device layer 110 (e.g., including the one or more buses 106 and/or microfluidic elements 108) and/or pressed downward along the "Y" direction depicted in FIG. 5 to force the sacrificial layer 502 into the one or more vias 102.

Figure 6:
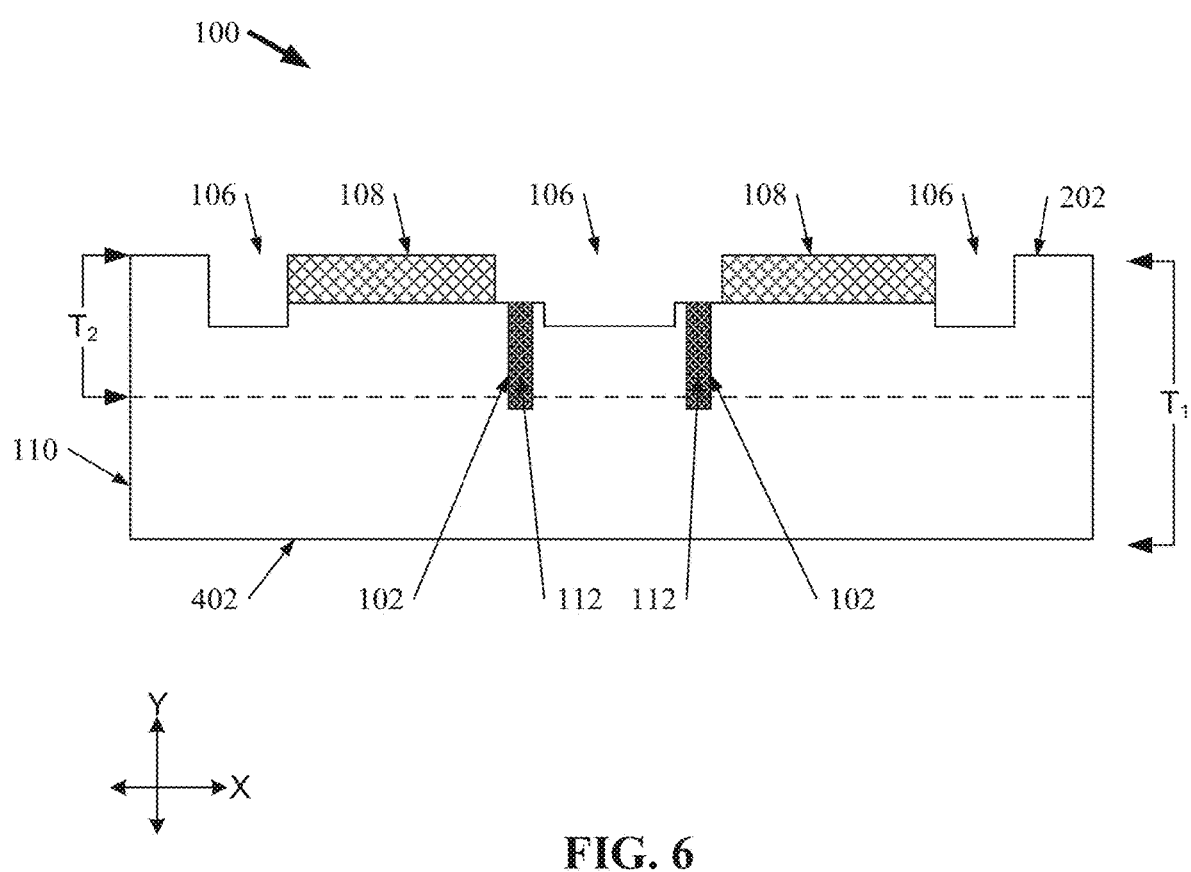
FIG. 6 illustrates a diagram of an example, non-limiting microfluidic chip at a fifth stage of manufacturing in accordance with one or more embodiments described herein.

FIG. 6 illustrates a diagram of an example, non-limiting microfluidic chip 100 at a fifth stage of manufacturing in accordance with one or more embodiments described herein. Repetitive description of like elements employed in other embodiments described herein is omitted for sake of brevity. For example, FIG. 6 can show a cross-section of the microfluidic chip 100 after completion of the fifth stage of manufacturing.

At the fifth stage of manufacturing, the sacrificial layer 502 can be etched back to form the one or more sacrificial plugs 112. For example, the sacrificial layer 502 can be removed from the top surface 202 of the device layer 110 (e.g., including the one or more buses 106) and/or the one or more microfluidic elements 108. The sacrificial layer 502 can remain positioned within the one or more vias 102 despite the etching back performed in the fifth stage of manufacturing, thereby forming the one or more sacrificial plugs 112. Additionally, the etching during the fifth stage of manufacturing can recess the sacrificial layer 502 into the one or more vias 102 (e.g., between 1 μm and/or 100 μm) to form recessed sacrificial plugs 112. In one or more embodiments, the sacrificial layer 502 can be etched back by one or more dry etching processes, which can include, but are not limited to: oxygen plasma etching, etching with a fluorine-containing gas (e.g., $CF_4$, $C_2F_6$, $C_4F_8$, $SF_6$, $NF_3$), a combination thereof, and/or the like.

Figure 7:
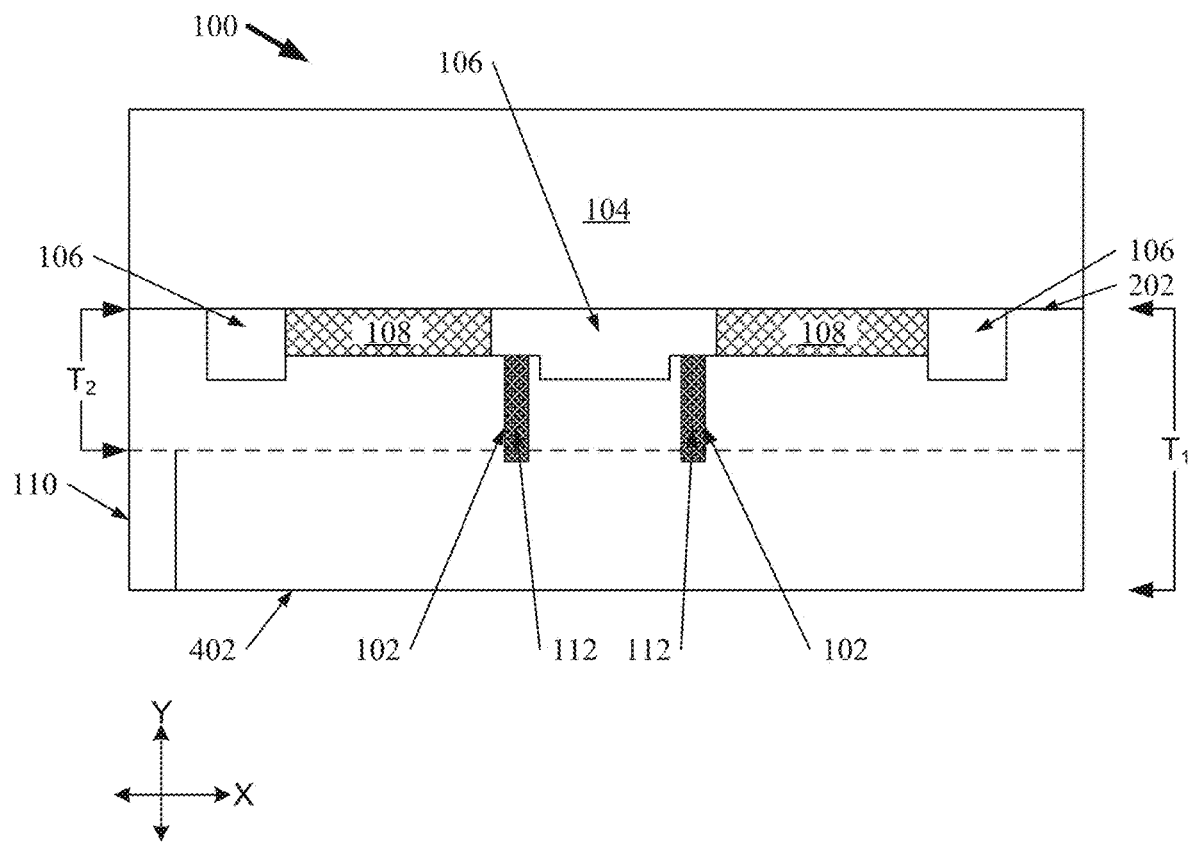
FIG. 7 illustrates a diagram of an example, non-limiting microfluidic chip at a sixth stage of manufacturing in accordance with one or more embodiments described herein.

FIG. 7 illustrates a diagram of an example, non-limiting microfluidic chip 100 at a sixth stage of manufacturing in accordance with one or more embodiments described herein. Repetitive description of like elements employed in other embodiments described herein is omitted for sake of brevity. For example, FIG. 7 can show a cross-section of the microfluidic chip 100 after completion of the sixth stage of manufacturing.

At the sixth stage of manufacturing, one or more sealing layers 104 can be bonded to the top surface 202 of the device layer 110 (e.g., and/or to an upper surface of the one or more microfluidic elements 108). For example, the sealing layer 104 can be permanently bonded to the device layer 110. The sealing layer 104 can be anodically bonded glass (e.g. Borofloat 33), a thermally bonded silicon wafer, and/or other substrates. Glass and/or other transparent substrate options offer the advantage of transparency for applications that require some kind of in situ analysis, such as fluorescence microscopy. Sealing the device layer 110 can serve at least two purposes: 1) it can prevent downstream damage, wetting, and process contamination from impacting the microfluidic chip 100 features, and 2) it can act as a support for a thinned device layer 110 when subsequently polished. The thickness of the sealing layer 104 can depend on the final thickness (e.g., represented by "$T_2$") of the device layer 110, wherein thinner final thickness (e.g., represented by "$T_2$") values can correlate to thicker sealing layers 104. For example, the sealing layer 104 can have a thickness ranging from greater than or equal to 100 µm to less than or equal to 2 mm (e.g., a glass sealing layer 104 of 700 µm).

Figure 8:
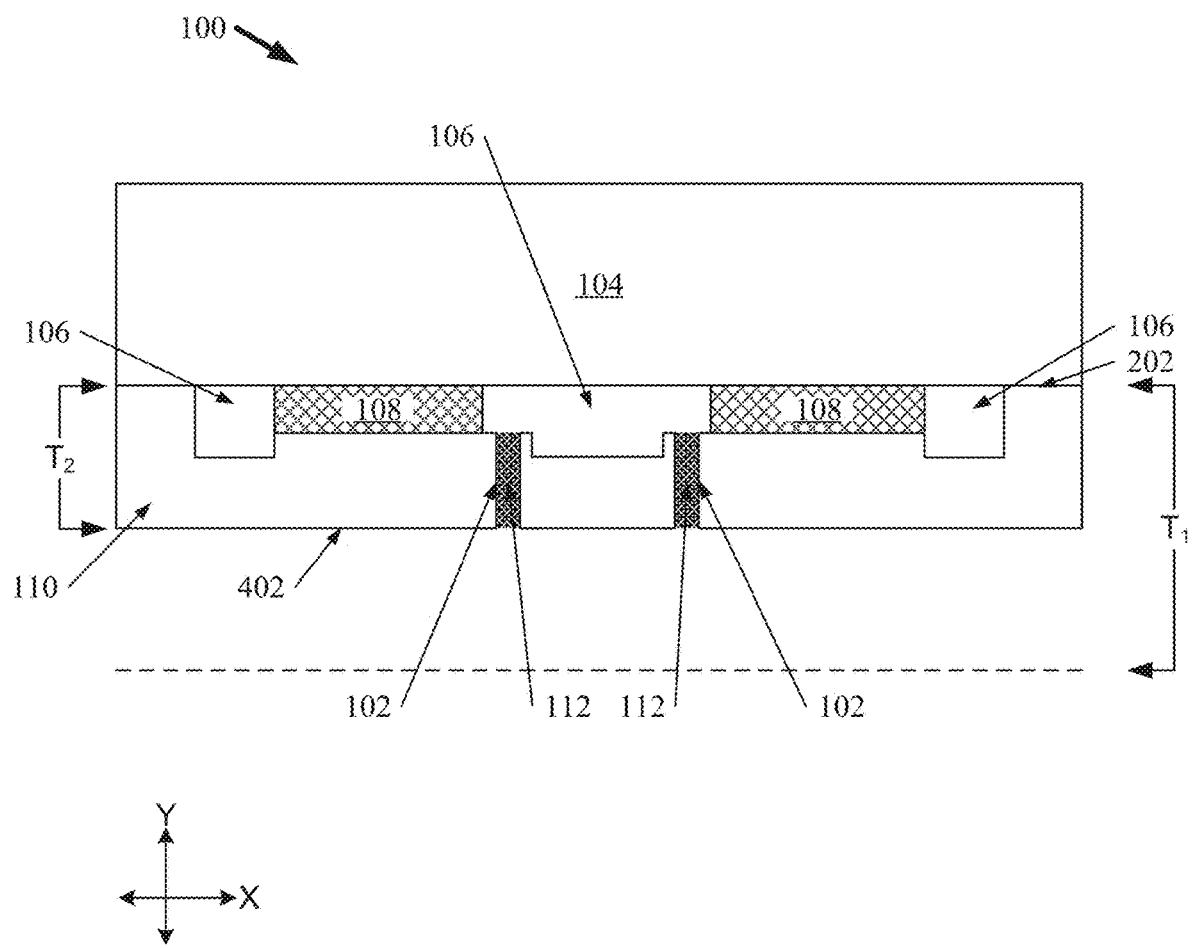
FIG. 8 illustrates a diagram of an example, non-limiting microfluidic chip at a seventh stage of manufacturing in accordance with one or more embodiments described herein.

FIG. 8 illustrates a diagram of an example, non-limiting microfluidic chip 100 at a seventh stage of manufacturing in accordance with one or more embodiments described herein. Repetitive description of like elements employed in other embodiments described herein is omitted for sake of brevity. For example, FIG. 8 can show a cross-section of the microfluidic chip 100 after completion of the seventh stage of manufacturing.

At the seventh stage of manufacturing, the thickness of the device layer 110 can be reduced from the initial thickness (e.g., represented by "$T_1$") to the final thickness (e.g., represented by "$T_2$"). For example, the dashed line in FIG. 8 can delineate the initial depth to which the device layer 110 extended in order to achieve the initial thickness (e.g., represented by "$T_1$"). The thinning at the seventh stage of manufacturing can be facilitated using a chemical-mechanical planarization ("CMP") and/or a wet process (e.g., TMAH and/or KOH etching). The device layer 110 can be thinned to a final thickness (e.g., represented by "$T_2$") greater than or equal to 7 µm and less than or equal to 500 µm (e.g., a silicon device layer 110 having a final thickness of 90 µm) post subsequent to the bonding of the sealing layer 104. Thus, the microfluidic chip 100 can comprise a thin substrate (e.g., device layer 110) to facilitate achieving a high density of vias 102. As a result of the thinning of the device layer 110, the one or more vias 102 (e.g., and/or the one or more sacrificial plugs 112) can extend completely through the device layer 110. For example, the one or more vias 102 (e.g., and/or the one or more sacrificial plugs 112) can extend from the top surface 202 of the device layer 110 to the bottom surface 402 of the device layer 110. In other words, the one or more vias 102 (e.g., and/or the one or more sacrificial plugs 112) can be exposed from the bottom surface 402 of the device layer 110.

Figure 9:
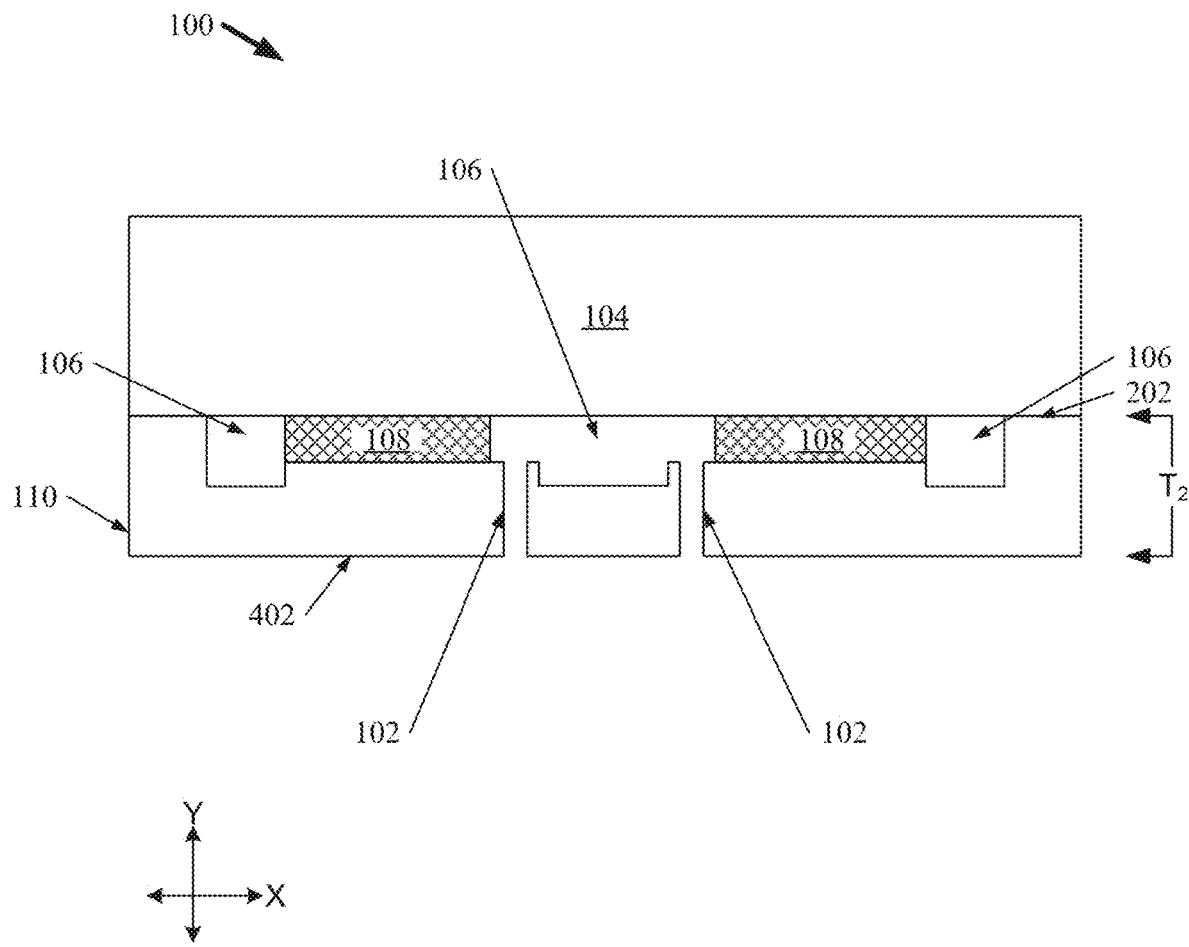
FIG. 9 illustrates a diagram of an example, non-limiting microfluidic chip at an eighth stage of manufacturing in accordance with one or more embodiments described herein.

FIG. 9 illustrates a diagram of an example, non-limiting microfluidic chip 100 at an eighth stage of manufacturing in accordance with one or more embodiments described herein. Repetitive description of like elements employed in other embodiments described herein is omitted for sake of brevity. For example, FIG. 9 can show a cross-section of the microfluidic chip 100 after completion of the eighth stage of manufacturing.

At the eighth stage of manufacturing, the one or more sacrificial plugs 112 can be removed from the one or more vias 102 to facilitate fluid communication through the one or more vias 102 (e.g., thereby rendering the one or more microfluidic elements 108 and/or the one or more buses 106 fluidically accessible). Extraction of the one or more sacrificial plugs 112 can be performed subsequent to one or more further manufacturing processes, such as chip dicing and/or chip singulation. Extracting the one or more sacrificial plugs 112 can be performed using one or more dry debonding processes, such as one or more dry etch processes (e.g., oxygen plasma etching). Advantageously, the one or more sacrificial plugs 112 can render the one or more vias 102 fluidically inaccessible during one or more manufacturing processes of microfluidic chip 100 (e.g., during thinning of the device layer 110 and/or chip singulation), thereby protecting one or more elements of the microfluidic chip 100 (e.g., the one or more microfluidic elements 108 and/or the one or more buses 106).

Figure 10:
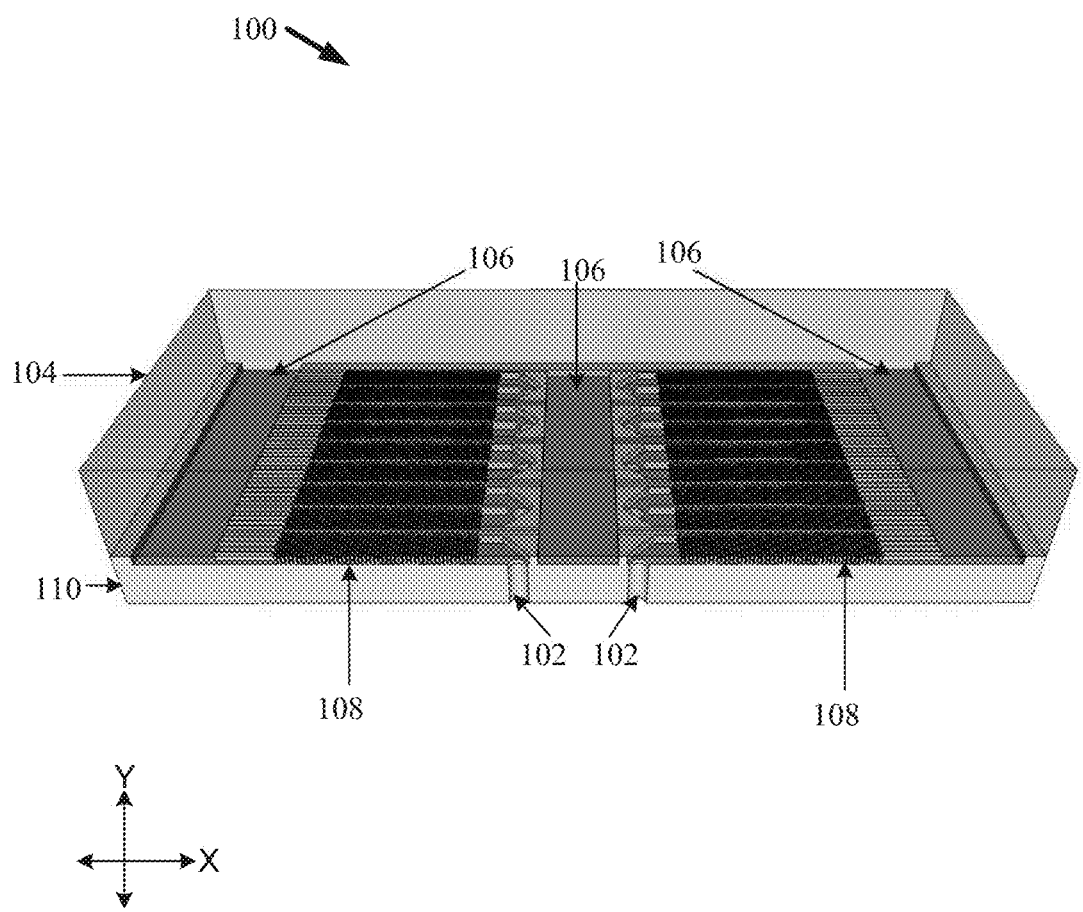
FIG. 10 illustrates a diagram of an example, non-limiting microfluidic chip that can comprise a high density of vias in accordance with one or more embodiments described herein.

FIG. 10 illustrates a diagram of an example, non-limiting microfluidic chip 100 after the one or more sacrificial plugs 112 are extracted from the one or more vias 102 in accordance with one or more embodiments described herein. Repetitive description of like elements employed in other embodiments described herein is omitted for sake of brevity. As shown in FIG. 10, the one or more sacrificial plugs 112 can be fully removed from the one or more vias 102 (e.g., to facilitate fluidic accessibility to the one or more microfluidic elements 108).

Figure 11:
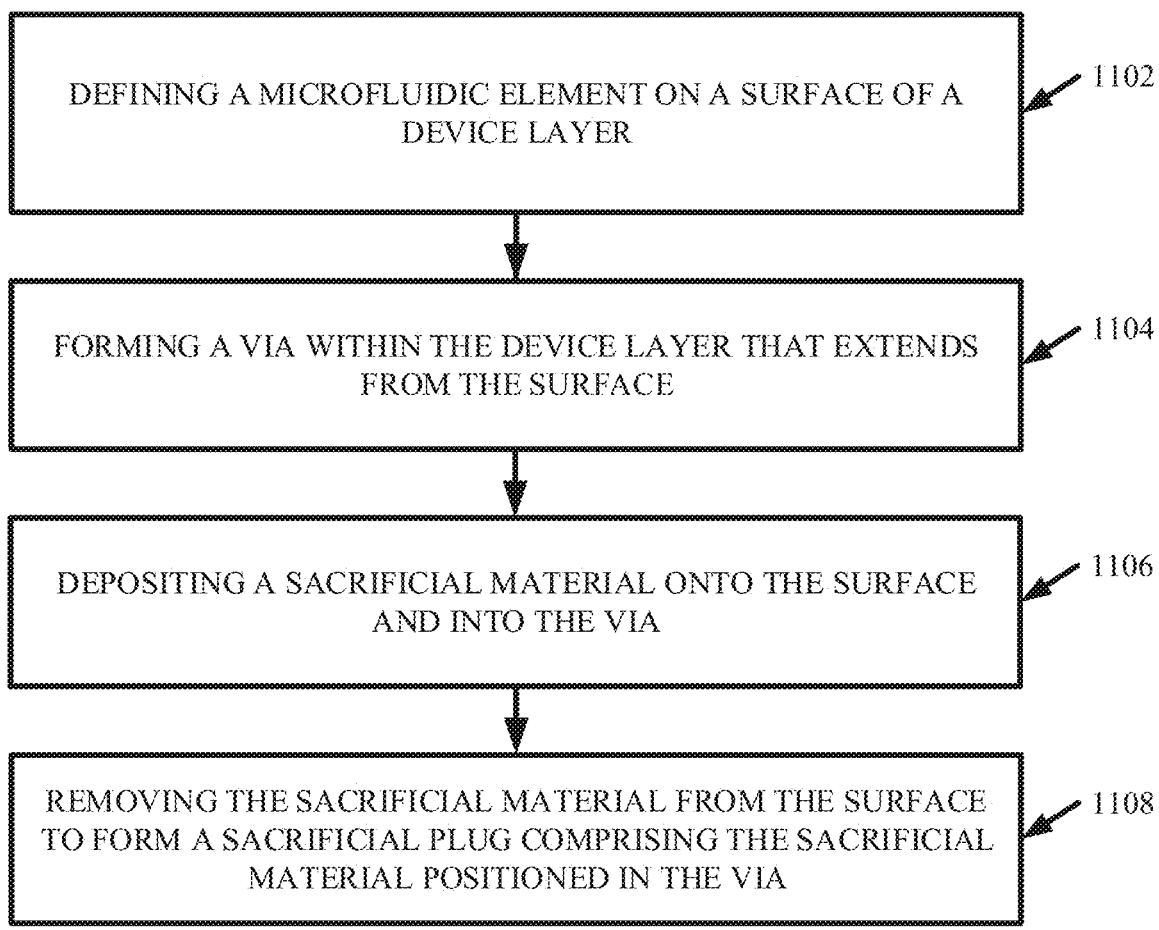
FIG. 11 illustrates a flow diagram of an example, non-limiting method that can facilitate manufacturing one or more microfluidic chips in accordance with one or more embodiments described herein.

FIG. 11 illustrates a flow diagram of an example, non-limiting method 1100 that can facilitate manufacturing of one or more microfluidic chips 100 in accordance with one or more embodiments described herein. Repetitive description of like elements employed in other embodiments described herein is omitted for sake of brevity.

At 1102, the method 1100 can comprise defining one or more microfluidic elements 108 on a surface (e.g., the top surface 202) of a device layer 110. For example, the defining at 1102 can comprise the first and/or second stage of manufacturing in accordance with one or more embodiments described herein. For instance, the one or more microfluidic elements 108 and/or the one or more buses 106 can be defined on a first lithography layer and patterned unto the top surface 202 of the device layer 110.

At 1104, the method 1100 can comprise forming one or more vias 102 within the device layer 110 that can extend from the surface (e.g., the top surface 202). For example, the forming of the vias 102 at 1104 can comprise the third stage of manufacturing in accordance with one or embodiments described herein. For instance, the one or more vias 102 can extend from the surface to a depth that is greater than the final thickness (e.g., represented by "$T_2$") of the device layer 110, wherein the final thickness (e.g., represented by "$T_2$") can be the thickness of the device layer 110 after one or more thinning processes during manufacturing of the microfluidic chip 100. The depth of the one or more vias 102 can be uniform or non-uniform. Additionally, the one or more vias 102 can be formed by one or more etching processes, such as RIE. In one or more embodiments, the one or more vias 102 can be formed in a high density on the surface (e.g., top surface 202) of the device layer 110 (e.g., a plurality of vias 102 formed at 1104 can comprise greater than or equal to about 100 vias 102 per square centimeter of the surface and less than or equal to about 100,000 vias 102 per square centimeter of the surface). Additionally, the one or more vias 102 can have diameters greater than or equal to 5 µm and less than or equal to 500 µm.

At 1106, the method 1100 can comprise depositing a sacrificial material (e.g., sacrificial layer 502) onto the surface (e.g., the top surface 202) and/or into the one or more vias 102. For example, the depositing at 1106 can comprise the fourth stage of manufacturing in accordance with one or more embodiments described herein. For instance, the sacrificial material can be stable at temperatures required in downstream processing of the microfluidic chip 100 (e.g., temperatures that are greater than or equal to 200 degrees Celsius (° C.) and less than or equal to 300° C.). For example, the sacrificial material can avoid cross-linking at the downstream processing temperatures. Additionally, the sacrificial material can be able to be etched back into the plurality of vias 102 to a depth greater than or equal to 1 µm and less than or equal to 100 µm. For example, the sacrificial material can be etched back with high selectivity to other materials (e.g., microfluidic elements 108) positioned on and/or within the device layer 110 (e.g., including the device layer 110 itself) using a dry etch process such as oxygen plasma etching. Further, the sacrificial material can enable the sealing layer 104 to be anodically bonded to the device layer 110 after the plurality of vias 102 are formed. Moreover, the sacrificial material can be fully extractable with one or more dry debonding processes after manufacturing of the microfluidic chip 100 (e.g., subsequent to wafer dicing and/or chip singulation). Example sacrificial materials can include, but are not limited to: polyimides (e.g., HD-3007 polyimide adhesive), temporary wafer bonding materials (e.g., BrewerBOND 305 temporary wafer bonding material), B-staged bisbenzocyclobutene ("BCB") monomers derived from resin (e.g., Cyclotene resin), a combination thereof, and/or the like. Additionally, the depositing at 1106 can be facilitated by one or more vacuum coating and/or spray coating processes.

At 1108, the method 1100 can comprise removing the sacrificial material (e.g., sacrificial layer 502) from the surface (e.g., the top surface 202) to form one or more sacrificial plugs 112 comprising the sacrificial material positioned in the one or more vias 102. For example, the removing at 1108 can comprise the fifth stage of manufacturing in accordance with one or more embodiments described herein. For instance, the sacrificial material can be etched back to form the one or more sacrificial plugs 112. Further, the sacrificial material can be recessed within the one or more vias 102 to form one or more recessed sacrificial plugs 112. Advantageously, method 1100 can form one or more plurality of vias 102 filled with one or more sacrificial plugs 112 that can be later extracted, wherein the sacrificial plugs 112 can render the one or more vias 102 fluidically inaccessible during the manufacturing of the microfluidic chip 100 to protect one or more features of the microfluidic chip 100 (e.g., the one or more microfluidic elements 108).

FIG. 12 illustrates a flow diagram of an example, non-limiting method 1200 that can facilitate manufacturing of one or more microfluidic chips 100 in accordance with one or more embodiments described herein. Repetitive description of like elements employed in other embodiments described herein is omitted for sake of brevity.

At 1202, the method 1200 can comprise defining one or more microfluidic elements 108 on a surface (e.g., the top surface 202) of a device layer 110. For example, the defining at 1202 can comprise the first and/or second stage of manufacturing in accordance with one or more embodiments described herein. For instance, the one or more microfluidic elements 108 and/or the one or more buses 106 can be defined on a first lithography layer and patterned unto the top surface 202 of the device layer 110.

At 1204, the method 1100 can comprise forming one or more vias 102 within the device layer 110 that can extend from the surface (e.g., the top surface 202). For example, the forming of the vias 102 at 1204 can comprise the third stage of manufacturing in accordance with one or embodiments described herein. For instance, the one or more vias 102 can extend from the surface to a depth that is greater than the final thickness (e.g., represented by "$T_2$") of the device layer 110, wherein the final thickness (e.g., represented by "$T_2$") can be the thickness of the device layer 110 after one or more thinning processes during manufacturing of the microfluidic chip 100. The depth of the one or more vias 102 can be uniform or non-uniform. Additionally, the one or more vias 102 can be formed by one or more etching processes, such as RIE. In one or more embodiments, the one or more vias 102 can be formed in a high density on the surface (e.g., top surface 202) of the device layer 110 (e.g., a plurality of vias 102 formed at 1104 can comprise greater than or equal to about 100 vias 102 per square centimeter of the surface and less than or equal to about 100,000 vias 102 per square centimeter of the surface). Additionally, the one or more vias 102 can have diameters greater than or equal to 5 μm and less than or equal to 500 μm.

At 1206, the method 1100 can comprise depositing a sacrificial material (e.g., sacrificial layer 502) onto the surface (e.g., the top surface 202) and/or into the one or more vias 102. For example, the depositing at 1206 can comprise the fourth stage of manufacturing in accordance with one or more embodiments described herein. For instance, the sacrificial material can be stable at temperatures required in downstream processing of the microfluidic chip 100 (e.g., temperatures that are greater than or equal to 200 degrees Celsius (° C.) and less than or equal to 300° C.). For example, the sacrificial material can avoid cross-linking at the downstream processing temperatures. Additionally, the sacrificial material can be able to be etched back into the plurality of vias 102 to a depth greater than or equal to 1 μm and less than or equal to 100 μm. For example, the sacrificial material can be etched back with high selectivity to other materials (e.g., microfluidic elements 108) positioned on and/or within the device layer 110 (e.g., including the device layer 110 itself) using a dry etch process such as oxygen plasma etching. Further, the sacrificial material can enable the sealing layer 104 to be anodically bonded to the device layer 110 after the plurality of vias 102 are formed. Moreover, the sacrificial material can be fully extractable with one or more dry debonding processes after manufacturing of the microfluidic chip 100 (e.g., subsequent to wafer dicing and/or chip singulation). Example sacrificial materials can include, but are not limited to: polyimides (e.g., HD-3007 polyimide adhesive), temporary wafer bonding materials (e.g., BrewerBOND 305 temporary wafer bonding material), B-staged bisbenzocyclobutene ("BCB") monomers derived from resin (e.g., Cyclotene resin), a combination thereof, and/or the like. Additionally, the depositing at 1106 can be facilitated by one or more vacuum coating and/or spray coating processes.

At 1208, the method 1100 can comprise removing the sacrificial material (e.g., sacrificial layer 502) from the surface (e.g., the top surface 202) to form one or more sacrificial plugs 112 comprising the sacrificial material positioned in the one or more vias 102. For example, the removing at 1208 can comprise the fifth stage of manufacturing in accordance with one or more embodiments described herein. For instance, the sacrificial material can be etched back to form the one or more sacrificial plugs 112. Further, the sacrificial material can be recessed within the one or more vias 102 to form one or more recessed sacrificial plugs 112.

At 1210, the method 1200 can comprise bonding one or more sealing layers 104 to the surface (e.g., the top surface 202) of the device layer 110, wherein a combination of the sealing layer 104 and/or the device layer 110 can encapsulate the one or more microfluidic elements 108. For example, the bonding at 1210 can comprise the sixth stage of manufacturing in accordance with one or more embodiments described herein. For instance, the sealing layer 104 can be anodically bonded to the device layer 110. Advantageously, the sealing layer 104 can provide mechanical strength to the microfluidic chip 100 during one or more subsequent stages of manufacturing.

At 1212, the method 1200 can comprise thinning the device layer 110 such that the one or more vias 102 can extend through the device layer 110 from the surface (e.g., the top surface 202) to a second surface (e.g., the bottom surface 402) of the device layer 110 opposite the surface. For example, the thinning at 1212 can comprise the seventh stage of manufacturing in accordance with one or more embodiments described herein. For instance, the thinning at 1212 can comprise thinning the device layer 110 from an initial thickness (e.g., represented by thickness "$T_1$"), which can be greater than the depth of the deepest via 102, to a final thickness (e.g., represented by "$T_2$"), which can be equal to or less than the depth of the shallowest via 102. Thereby, the one or more sacrificial plugs 112 can be exposed from the second surface (e.g., the bottom surface 402) of the device layer 110. Advantageously, the method 1200 can enable a high density of vias 102 to be formed into the top surface 202 of the device layer 110, which can in turn enable precise formation and/or location of the vias 102.

In one or more embodiments, the method 1200 can further comprise extracting the one or more sacrificial plugs 112 by one or more dry debonding processes. For example, the one or more sacrificial plugs 112 can be extracted subsequent to a dicing process (e.g., to facilitate chip singulation).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a silicon device layer of a microfluidic chip comprising a plurality of vias extending through the silicon device layer, wherein the plurality of vias comprise greater than or equal to about 100 vias per square centimeter of a surface of the silicon device layer and less than or equal to about 100,000 vias per square centimeter of the surface of the silicon device layer;
   a plurality of sacrificial plugs that respectively fill the plurality of vias, wherein the plurality of sacrificial plugs comprise a sacrificial material and are not integrally connected to each other by the sacrificial material, and wherein the plurality of sacrificial plugs block fluid communication through the plurality of vias; and
   a microfluidic element on the surface of the silicon device layer and adjacent to the plurality of vias, wherein the microfluidic element comprises a nanoscale condenser array.

2. The apparatus of claim 1, wherein the plurality of sacrificial plugs are extractable by a dry debonding process.

3. The apparatus of claim 1, wherein the sacrificial material comprises a polyimide adhesive.

4. The apparatus of claim 1, wherein the respective removable sacrificial plugs are removable by an oxygen plasma debonding process.

5. The apparatus of claim 1, wherein the plurality of vias have respective diameters greater than or equal to 5 μm and less than or equal to 0.5 mm.

6. The apparatus of claim 1, wherein the sacrificial material comprises a temporary wafer bonding material.

7. The apparatus of claim 1, wherein the sacrificial material comprises a B-staged bisbenzocyclobutene monomer derived resin.

8. An apparatus, comprising:
   a silicon device layer of a microfluidic chip comprising a plurality of vias extending through the silicon device layer, wherein the plurality of vias comprise respective removable sacrificial plugs that fill the plurality of vias, wherein the respective removable sacrificial plugs comprise a sacrificial material and are not integrally connected to each other by the sacrificial material, and wherein the respective removable sacrificial plugs block fluid communication through the plurality of vias, wherein the plurality of vias have respective diameters greater than or equal to 5 μm and less than or equal to 0.5 mm; and
   a nanoscale condenser array on the surface of the silicon device layer and adjacent to the plurality of vias.

9. The apparatus of claim 8, wherein the plurality of vias comprise greater than or equal to about 100 vias per square centimeter of a surface of the silicon device layer and less than or equal to about 100,000 vias per square centimeter of the surface of the silicon device layer.

10. The apparatus of claim 8, wherein the respective removable sacrificial plugs are removable by a dry debonding process.

11. The apparatus of claim 8, wherein the respective removable sacrificial plugs are removable by an oxygen plasma debonding process.

12. The apparatus of claim 8, wherein the sacrificial material comprises a polyimide adhesive.

13. The apparatus of claim 8, wherein the sacrificial material comprises a temporary wafer bonding material.

14. The apparatus of claim 8, wherein the sacrificial material comprises a B-staged bisbenzocyclobutene monomer derived resin.

15. An apparatus, comprising:
   a silicon device layer of a microfluidic chip comprising a plurality of vias extending through the silicon device layer, wherein the plurality of vias comprise greater than or equal to about 100 vias per square centimeter of a surface of the silicon device layer and less than or equal to about 100,000 vias per square centimeter of the surface of the silicon device layer;

a plurality of sacrificial plugs that respectively fill the plurality of vias, wherein the plurality of sacrificial plugs comprise a sacrificial material and are not integrally connected to each other by the sacrificial material, and wherein the plurality of sacrificial plugs block fluid communication through the plurality of vias; and a microfluidic element on the surface of the silicon device layer and adjacent to the plurality of vias, wherein the microfluidic element comprises a deterministic lateral displacement array.

16. The apparatus of claim 15, wherein the plurality of sacrificial plugs are extractable by a dry debonding process.

17. The apparatus of claim 15, wherein the sacrificial material comprises a polyimide adhesive.

18. The apparatus of claim 15, wherein the sacrificial material comprises a temporary wafer bonding material.

19. The apparatus of claim 15, wherein the sacrificial material comprises a B-staged bisbenzocyclobutene monomer derived resin.

20. The apparatus of claim 15, wherein the respective removable sacrificial plugs are removable by an oxygen plasma debonding process.

* * * * *